(12) United States Patent
Tsukuda et al.

(10) Patent No.: US 8,089,004 B2
(45) Date of Patent: Jan. 3, 2012

(54) SEMICONDUCTOR DEVICE INCLUDING WIRING EXCELLENT IN IMPEDANCE MATCHING, AND METHOD FOR DESIGNING THE SAME

(75) Inventors: Tatsuaki Tsukuda, Kanagawa (JP); Masayoshi Hirata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 397 days.

(21) Appl. No.: 12/232,889

(22) Filed: Sep. 25, 2008

(65) Prior Publication Data

US 2009/0084592 A1 Apr. 2, 2009

(30) Foreign Application Priority Data

Sep. 28, 2007 (JP) ................................. 2007-253155

(51) Int. Cl.
*H05K 1/16* (2006.01)
(52) U.S. Cl. ....................................... 174/260; 361/760

(58) Field of Classification Search ................... 174/260, 174/261; 361/760, 764
See application file for complete search history.

(56) References Cited

U.S. PATENT DOCUMENTS

| | | | | |
|---|---|---|---|---|
| 6,469,908 | B2* | 10/2002 | Patel et al. | 361/760 |
| 7,110,263 | B2* | 9/2006 | He et al. | 361/794 |
| 2007/0290302 | A1* | 12/2007 | Nakagawa et al. | 257/668 |
| 2010/0315790 | A1* | 12/2010 | Imaoka et al. | 361/748 |

FOREIGN PATENT DOCUMENTS

| | | |
|---|---|---|
| JP | 7-106759 | 4/1995 |
| JP | 2000-174168 | 6/2000 |

\* cited by examiner

*Primary Examiner* — Yuriy Semenenko
(74) *Attorney, Agent, or Firm* — McGinn IP Law Group, PLLC

(57) ABSTRACT

A semiconductor device includes an interposer, and a semiconductor chip mounted on the interposer. In a plan view, the interposer includes a first region overlapping the semiconductor chip, and a second region excluding the first region. The interposer includes at least one wiring formed astride the first region and the second region. The cross-sectional area of the wiring in the first region and the cross-sectional area of the wiring in the second region are different from each other.

12 Claims, 15 Drawing Sheets

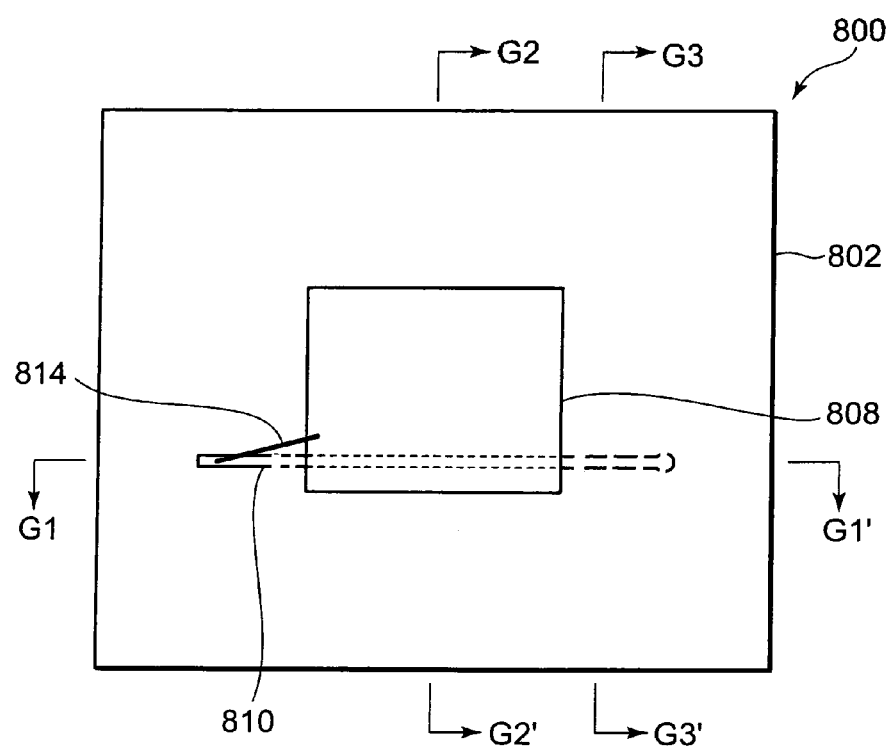
RELATED ART  FIG. 17

RELATED ART FIG. 18A
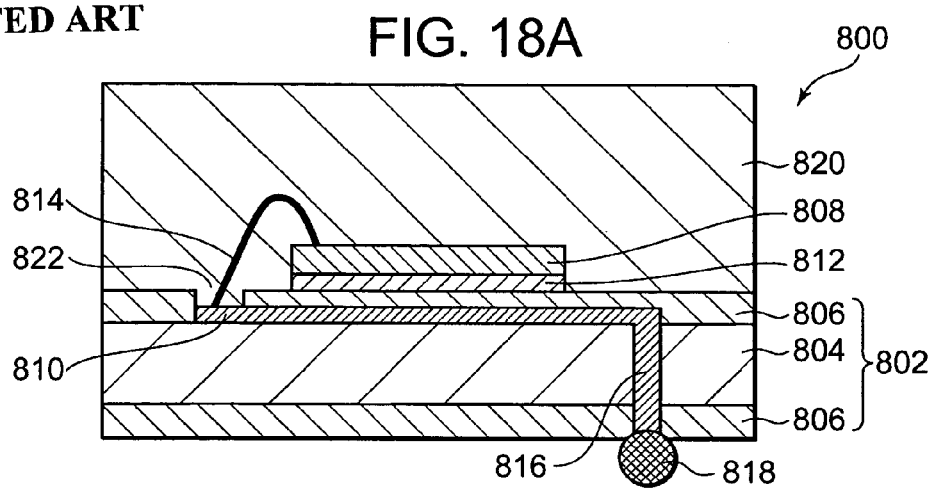
RELATED ART FIG. 18B
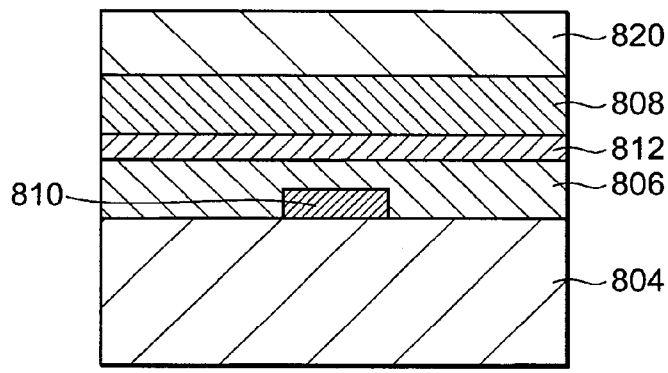
RELATED ART FIG. 18C
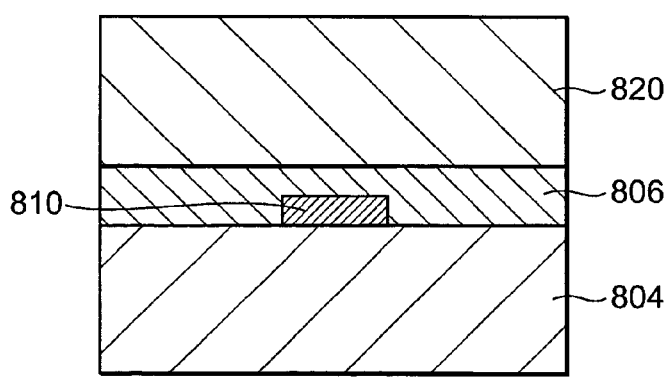

SEMICONDUCTOR DEVICE INCLUDING WIRING EXCELLENT IN IMPEDANCE MATCHING, AND METHOD FOR DESIGNING THE SAME

BACKGROUND OF THE INVENTION

1. Field of the Invention

The present invention relates to a semiconductor device and a method for designing the same.

2. Description of the Related Art

Conventional examples of a semiconductor device including a semiconductor chip mounted on an interposer include one with the configuration shown in FIGS. 17 and 18. FIG. 17 is a plan view of the conventional semiconductor device, and FIG. 18 is a cross-sectional view thereof.

As shown in FIGS. 17 and 18, a semiconductor device 800 includes an interposer 802 and a semiconductor chip 808. On the interposer 802, the semiconductor chip 808 is mounted via a mounting material 812, with its circuit-formed surface upside. The semiconductor chip 808 is sealed with a molding resin 820.

The interposer 802 includes an insulating layer 804 including a wiring 810, and solder resists 806 covering surfaces of the insulating layer 804. The wiring 810 is exposed at the bottom of an opening 812 provided in one of the solder resists 806, and the exposed portion of the wiring 810 and the circuit (not shown) on the semiconductor chip 808 are electrically connected via a wire 814.

The width and thickness of the wiring 810 is uniform in the interposer 802. For simplicity, FIG. 17 shows only one wiring 810, but an actual semiconductor device normally includes a plurality of wirings.

On the back surface of the interposer 802, a solder ball 818 is provided as an external connection terminal. The solder ball 818 and the wiring 810 are electrically connected via a through electrode 816.

When an electric signal passes through the wiring 810, it is necessary to provide an impedance match over the entire wiring. A failure to provide an impedance match may result in reflection and/or waveform distortion of the signal, deteriorating the transmission characteristics. The effect of an impedance mismatch is large especially in the case where a high speed signal is transmitted.

The configuration of the aforementioned conventional semiconductor device is disclosed in, e.g., Japanese Patent Laid-Open No. 2000-174168 (patent document 1).

Also, Japanese Patent Laid-Open No. 7-106759 (patent document 2) discloses a thin-film multilayer substrate having a stripline structure or a microstripline structure, wherein the impedances of a signal line and a device are matched by changing the width, thickness and/or material of the signal line.

However, the semiconductor device 800 has a problem in that when a high-speed signal is transmitted through the wiring 810, reflection and/or waveform distortion of the signal may occur, deteriorating the transmission characteristics.

As a result of earnest study, the present inventors have found the cause of the problem. The wiring 810 has a capacitance between it and a conductor having a fixed potential. Furthermore, the inductance value of the wiring 810 varies as a result of interaction between it and the conductor having a fixed potential. Thus, conventionally, the characteristic impedance of the wiring 810 is estimated by calculating capacitance and inductance values for the entire wiring 810 with a power supply layer or a ground layer in a printed wiring board (not shown), on which the semiconductor device 800 is mounted, as a reference conductor plane. However, in an actual semiconductor device 800, the semiconductor chip 808 acts as a reference conductor plane for the wiring 810 and changes the capacitance and/or inductance of the region of the wiring 810 below the semiconductor chip 808, and as a result, the characteristic impedance of the region of the wiring will change. Consequently, a characteristic impedance mismatch occurs in the middle of the wiring 810, which causes reflection and/or waveform distortion of a signal, deteriorating the transmission characteristics.

The aforementioned problem is especially significant for a high-speed digital signal, etc., which has sharply falling and rising waves. Accordingly, with the recent increase in speed of semiconductor devices, the problem has become increasingly serious.

The means disclosed in patent document 2 matches the impedances of the semiconductor chip and the signal line, but the effect of the semiconductor chip is not taken into account at all.

In order to reduce the effect of such characteristic impedance change, conventionally, in general, a chip capacitor and/or a chip resistor is added in the interposer to match the characteristic impedances. This requires addition of members and an increase in manufacturing steps, causing a rise in manufacturing costs.

SUMMARY OF THE INVENTION

A semiconductor device according to the present invention provides a semiconductor device comprising an interposer, and a semiconductor chip mounted on the interposer, wherein: in a plan view, the interposer includes a first region overlapping the semiconductor chip, and a second region excluding the first region, and the interposer includes at least one wiring therein, the wiring being formed astride the first region and the second region; and a cross-sectional area of the wiring in the first region of the interposer and a cross-sectional area of the wiring in the second region of the interposer are different from each other.

In the semiconductor device according to the present invention, a characteristic impedance of the wiring in the first region may be substantially equal to a characteristic impedance of the wiring in the second region. As a result, waveform distortion and/or reflection of a signal traveling in the wiring can be reduced.

In the semiconductor device according to the present invention, a width of the wiring in the first region may be narrower than a width of the wiring in the second region.

A thickness of the wiring in the first region may be thinner than a thickness of the wiring in the second region. Also, a lower surface of the wiring in the first region and a lower surface of the wiring in the second region may be on a same plane.

In the semiconductor device according to the present invention, the interposer may include a plurality of wiring layers, and the wiring in the first region and the wiring in the second region may be provided in different wiring layers.

Also, a method for designing a semiconductor device according to the present invention provides a method for designing a semiconductor device including an interposer with a semiconductor chip mounted thereon and a printed wiring board with the interposer mounted thereon, in a plan view, the interposer including a first region overlapping the semiconductor chip, and a second region excluding the first region, and the interposer including at least one wiring therein, the wiring being formed astride the first region and the second region, the method comprising: calculating a capacitance and an inductance of the wiring in the second region with a wiring layer in the printed wiring board or the interposer as a reference conductor plane to calculate a characteristic impedance of the wiring in the second region; calculating a capacitance and an inductance of the wiring in the first region with the wiring layer in the printed wiring board or the interposer as a reference conductor plane, and a capacitance and an inductance of the wiring in the first region with a surface of the semiconductor chip facing the interposer as a reference conductor plane, to calculate a characteristic impedance of the wiring in the first region; and making a cross-sectional area of the wiring in the second region of the interposer and a cross-sectional area of the wiring in the first region of the interposer be different from each other to make the characteristic impedance in the first region and the characteristic impedance in the second region be substantially equal to each other.

Here, the "reference conductor plane" refers to a conductor having a fixed potential, and may be, e.g., a power supply layer or a ground layer in the printed wiring board. In the present invention, the semiconductor chip is also taken into consideration as a reference conductor plane.

The present invention enables the provision of a semiconductor device having favorable transmission characteristics that provide an impedance match over the entire wiring in the interposer without addition of passive components such as a chip capacitor and/or a chip resistor, etc., and a method for designing the device.

BRIEF DESCRIPTION OF THE DRAWINGS

FIG. 17 is a plan view of a conventional semiconductor device; and

FIG. 18A to 18C are cross-sectional views of a conventional semiconductor device.

DETAILED DESCRIPTION OF THE PREFERRED EMBODIMENTS

Figure 1:
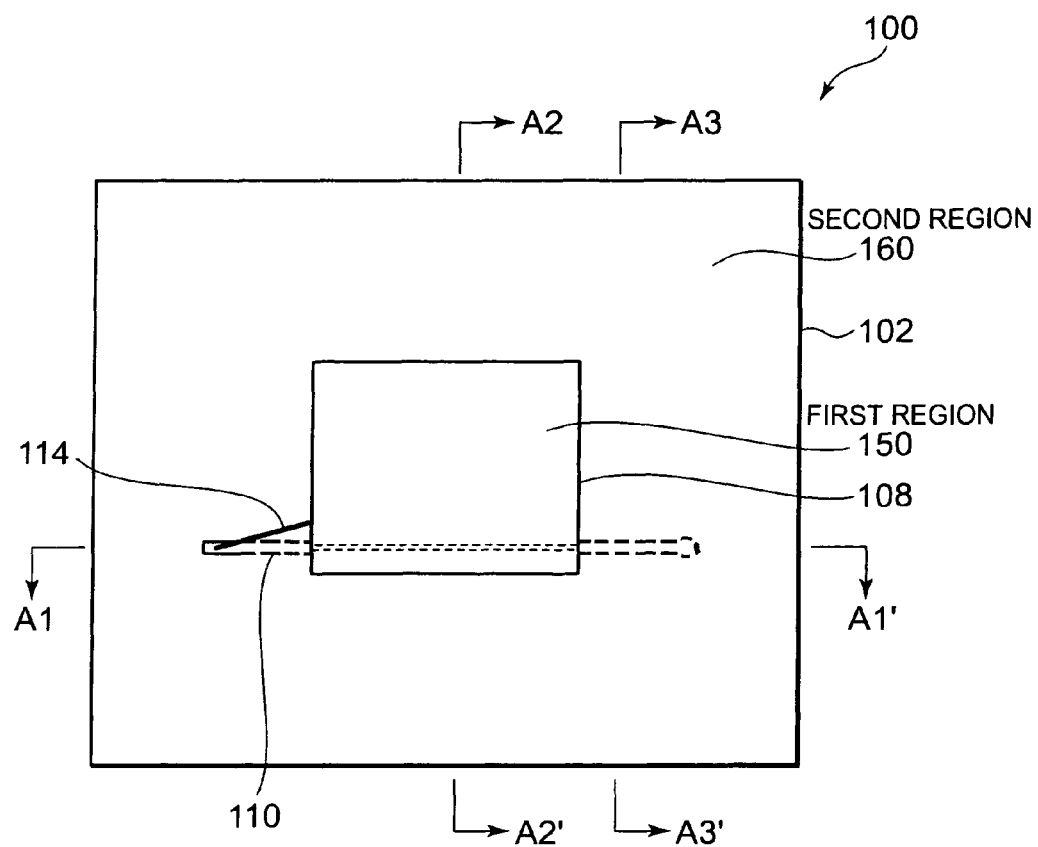
FIG. 1 is a plan view of a first embodiment of a semiconductor device according to the present invention.

Hereinafter, preferred embodiments of the present invention will be described in details with reference to the drawings. In the description of the drawings, the same components are provided with the same reference numerals and the description thereof will not be repeated.

First Embodiment

Figure 2A:
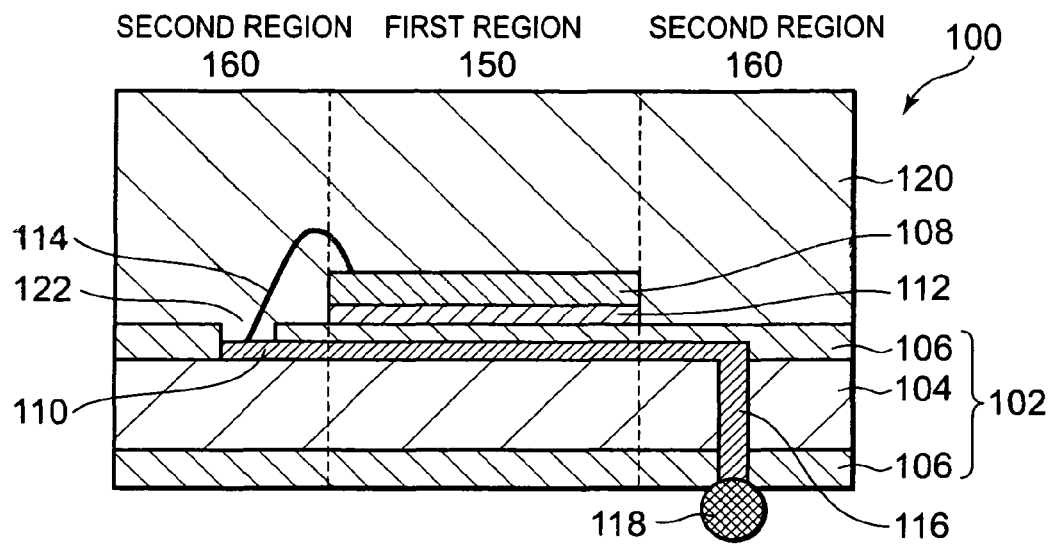
FIGS. 2A to 2C are cross-sectional views of a first embodiment of a semiconductor device according to the present invention.
Figure 2B:
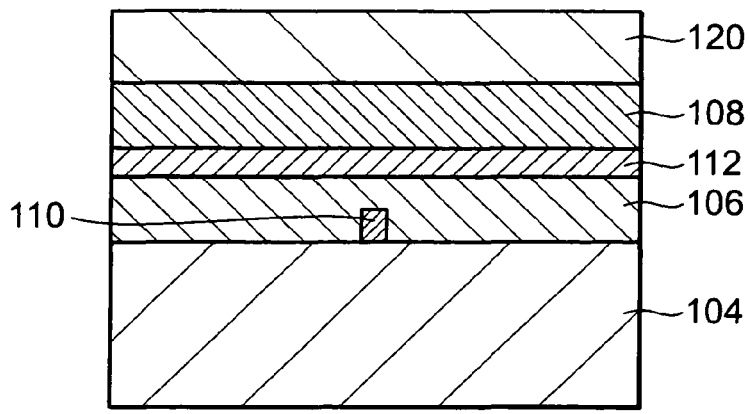
Figure 2C:
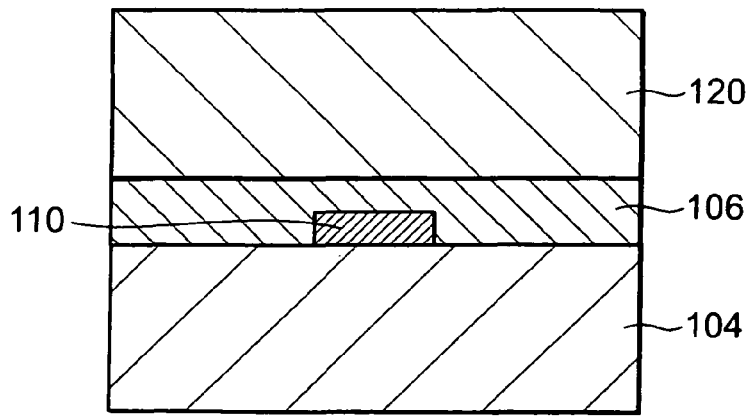

FIG. 1 is a plan view of the configuration of a semiconductor device 100 according to the present embodiment. FIG. 2A is a cross-sectional view of the semiconductor device 100 taken along A1-A1' of FIG. 1. FIG. 2B is an enlarged view of a portion of the semiconductor device 100 around a wiring in cross section taken along A2-A2' of FIG. 1. FIG. 2C is an enlarged view of a portion of the semiconductor device 100 around a wiring in cross section taken along A3-A3' of FIG. 1. In FIG. 1, a molding resin 120 is not shown.

The semiconductor device 100 includes an interposer 102 and a semiconductor chip 108. On the interposer 102, the semiconductor chip 108 is mounted via a mounting material 112, with its circuit-formed surface upside.

The semiconductor chip 108 may be, e.g., an LSI having a logic circuit function, an LSI having a general-purpose memory circuit function, or an LSI having an embedded DRAM circuit function. In the present embodiment, the semiconductor chip 108 is an LSI having a logic circuit function.

The interposer 102 includes an insulating layer 104 including multilayer wirings, and solder resists 106 covering surfaces thereof. In FIG. 2, only one wiring layer in the interposer 102 is shown. In one of the solder resists 106, an opening 122 is provided, and at the bottom of the opening, a wiring 110 is exposed, the exposed portion of the wiring 110 and a pad (not shown) on the semiconductor chip 108 are electrically connected via a wire 114.

The interposer 102 includes at least one wiring 110 therein. The wiring 110 is a signal line. As shown in FIG. 1, the interposer 102 includes a first region 150 overlapping the semiconductor chip 108 in a plan view, and a second region 160 excluding the first region 150. For simplicity, FIG. 1 shows only one wiring 110, but an actual semiconductor device includes a plurality of wirings.

The wiring 110, as shown in FIG. 2A, is formed astride the first region 150 and the second region 160 in a plan view. Also, as shown in FIGS. 2B and 2C, the cross-sectional area of the wiring 110 in the interposer 102 is different between the first region 150 and the second region 160. More specifically, in the present embodiment, the width of the wiring in the first region 150 is narrower than the width of the wiring in the second region 160.

A through electrode 116 provided in the interposer 102 electrically connects the wiring 110 and a solder ball provided on the back-surface of the interposer.

Next, a method for designing a semiconductor device according to the present invention will be described. In the method for designing a semiconductor device according to the present invention, characteristic impedance calculations for a wiring are included as main steps. Accordingly, first, formulae necessary for characteristic impedance calculation will be described.

The characteristic impedance Z0 of a wiring is calculated by the following formula where L0 is the inductance per unit length and C0 is the capacitance per unit length between a reference conductor plane and the wiring:

$$Z0=\sqrt{(L0/C0)}[\Omega] \quad \text{[Formula 1]}$$

Here, the "reference conductor plane" means a conductor having a fixed potential.

The capacitance C between the reference conductor plane and the wiring is calculated by the following well-known formula where $\epsilon 0$ is the vacuum permittivity, $\epsilon r$ is the relative permittivity of an insulator between the wiring and the reference conductor plane, d is the distance between the reference conductor plane and the wiring, and S is the dimension of the area of the reference conductor plane and the wiring facing each other:

$$C=\epsilon 0 \epsilon r S/d [F] \quad \text{[Formula 2]}$$

Characteristic impedance calculation requires a capacitance per unit length. Where w is the width of the wiring [mm] and h is the distance between the wiring and the reference conductor plane [mm], the capacitance C0 per centimeter of the length of the wiring can be calculated by $$C0=10-2\times\epsilon 0 \epsilon r w/h [F]. \quad \text{[Formula 3]}$$

Also, the inductance per centimeter of the length of the wiring can be calculated by the following formula.

$$L0=1.97\times 10-9\times \ln(2\pi h/w)[H] \quad \text{[Formula 4]}$$

According to the above, the characteristic impedance Z0 of the wiring can be calculated by assigning the results of calculations according to formulae 2 and 3 to formula 4.

In conventional semiconductor device designing, a characteristic impedance is calculated with a power supply layer or a ground layer provided in a printed wiring board or an interposer as a reference conductor plane. Thus, the cross-sectional area, such as the width and thickness, of the wiring in the interposer is designed to be uniform.

However, in an actual semiconductor device, a semiconductor chip is mounted on an interposer, and in addition, the semiconductor chip is closer to the wiring than the power supply layer or the ground layer in the printed wiring board. Thus, in the region where the interposer and the semiconductor chip overlap in a plan view (the first region), the semiconductor chip also acts as a reference conductor plane for the wiring, which affects the capacitance and inductance of the wiring. In other words, in the region where the interposer and the semiconductor chip overlap in a plan view (the first region), the characteristic impedance of the wiring varies. In the present invention, the semiconductor device is designed taking the semiconductor chip into account as a reference conductor plane for the wiring as well for the region where the interposer and the semiconductor chip overlap in a plan view (the first region).

Figure 3:
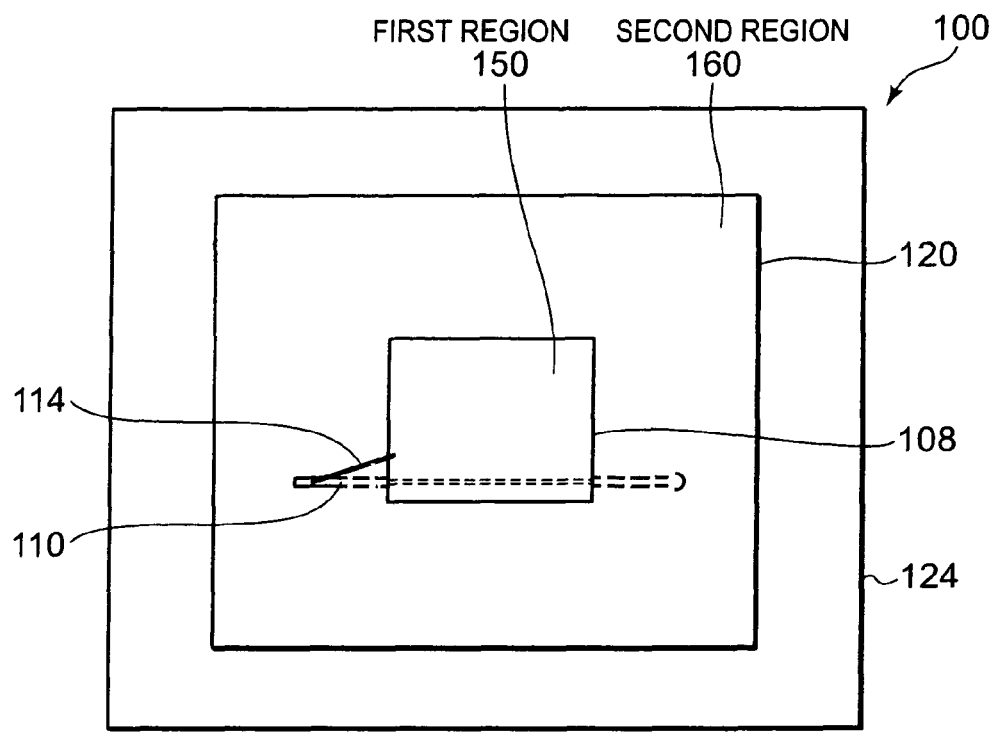
FIG. 3 is a diagram for describing a method for designing a first embodiment of a semiconductor device according to the present invention.
Figure 4:
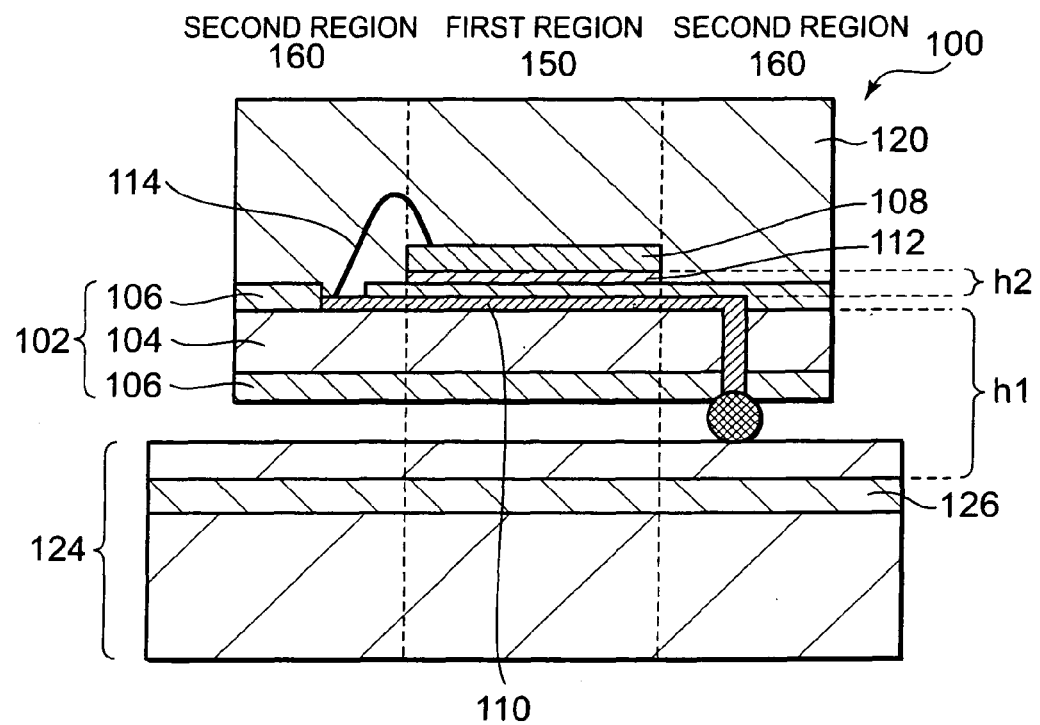
FIG. 4 is a diagram for describing a method for designing a first embodiment of a semiconductor device according to the present invention.

FIGS. 3 and 4 are diagrams illustrating a method for designing the semiconductor device 100 according to the present invention. The semiconductor device 100 is mounted on a printed wiring board 124.

In a plan view, the interposer 102 includes the first region 150 overlapping the semiconductor chip 108, and the second region 160 excluding the first region 150. The interposer 102 includes at least one wiring 110 formed astride the first region 150 and the second region 160.

In the designing method according to the present invention, as shown in FIG. 4, for the second region 160, the capacitance and the inductance of the wiring is calculated with a wiring layer 126 in the printed wiring board 124 as a reference conductor plane, and the characteristic impedance of the wiring in the second region 160 is calculated based on the calculation result. Meanwhile, for the first region 150, the capacitance and inductance of the wiring with the wiring layer 126 in the printed wiring board 124 as a reference conductor plane, and the capacitance and inductance of the wiring with the semiconductor chip 108 as a reference conductor plane are both calculated, and the characteristic impedance of the wiring in the first region 150 is calculated based on the calculation results. Furthermore, the characteristic impedance in the first region 150 and the characteristic impedance in the second region 160 are made to be substantially the same based on the above-described characteristic impedance calculations by making the cross-sectional area of the wiring 110 in the interposer 102 in the second region 160 and the cross-sectional area of the wiring 110 in the interposer 102 in the first region 150 to be different from each other.

Figure 5:
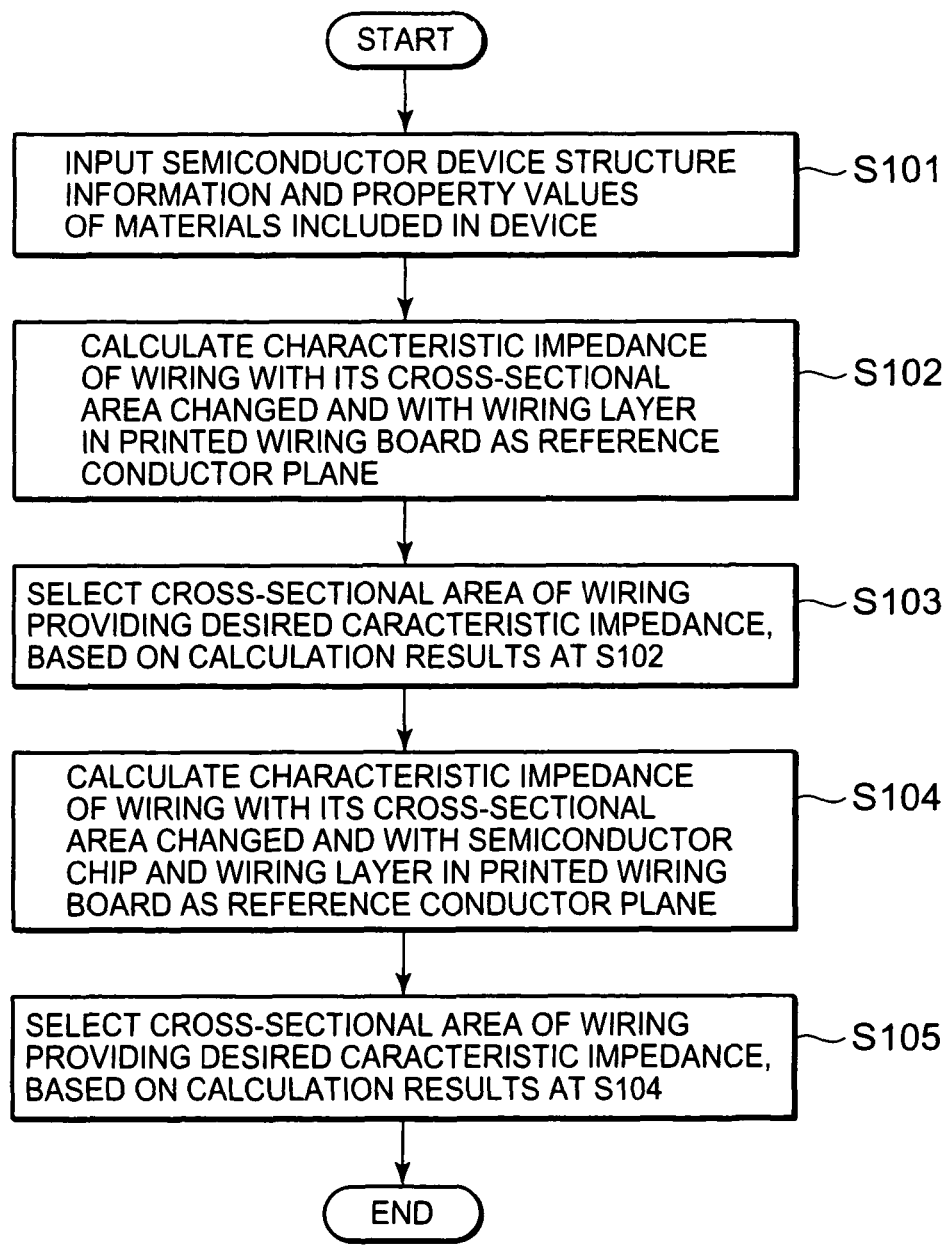
FIG. 5 is a flowchart illustrating a method for designing a first embodiment of a semiconductor device according to the present invention.

FIG. 5 is a flowchart illustrating a method for designing the semiconductor device 100. At first, information on the structure of the semiconductor device, and the property values of materials included in the semiconductor device are acquired (S101). More specifically, the semiconductor device structure information may include, e.g., the thickness of each layer, the thickness of a mounting material, the height of solder balls, the positions of the power supply/ground layers in the printed wiring board. Also, the property values of the materials included in the semiconductor device may include the values of the relative permittivities of the respective materials.

Next, the capacitance and inductance of the wiring in the second region 160 is calculated with the cross-sectional area, such as the width and/or thickness, of the wiring changed and with a wiring layer in the printed wiring board as a reference conductor plane. For the calculation of the capacitance and inductance, formulae 2 and 3 are used. Using the calculation results, several different characteristic impedances in the second region are calculated for the respective cross-sectional areas using formula 4 (S102).

Subsequently, a cross-sectional area for the wiring in the second region 160 is selected based on the calculation results at step S102 so that the characteristic impedance in the second region 160 has a desired value (S103). The desired value may be, e.g., a value substantially equal to the input/output impedance of the semiconductor chip 108.

Next, the capacitance and inductance of the wiring in the first region 150 is calculated with the cross-sectional area, such as the width and/or thickness, of the wiring changed and with the wiring layer in the printed wiring board as a reference conductor plane. For the calculation of the capacitance and inductance, formulae 2 and 3 are used. Using the calculation results, several different characteristic impedances in the first region are calculated for the respective cross-sectional areas using formula 4 (S104).

Subsequently, a cross-sectional area for the wiring in the first region 150 is selected based on the calculation results at step S104 so that the characteristic impedance in the first region 150 has a desired value (S105). The desired value may be, e.g., a value substantially equal to the value selected at step S103. In other words, the characteristic impedance of the wiring in the first region and the characteristic impedance of the wiring in the second region can be made to be substantially equal to each other.

In the present specification, "the characteristic impedances are substantially equal to each other" means that the difference between the characteristic impedances is within the range of ±10%, more preferably, ±5%. If the difference in characteristic impedance is within this range, it is possible to sufficiently eliminate the effects of waveform distortion and/ or reflection of a signal. Furthermore, the manufacture control can be conducted within this range also for variations occurring in the manufacturing process.

Examples of the results of designing the semiconductor device 100 using the above-described designing flow are shown in Table 1. In the calculation, h1=240 μm, h2=70 μm, the relative permittivity of the insulator included in each of the interposer and the printed wiring board was 4.7, and the relative permittivity of each of the mounting material and the solder resists was 3.0.

TABLE 1

| Comparative Example | Wiring Thickness | Wiring Width | | Characteristic Impedance | |
|---|---|---|---|---|---|
| | | First Region | Second Region | First Region | Second Region |
| 1 | 15 μm | 270 μm | 270 μm | 35 Ω | 56 Ω |
| 2 | 15 μm | 40 μm | 40 μm | 84 Ω | 98 Ω |
| 3 | 15 μm | 80 μm | 270 μm | 62 Ω | 56 Ω |

In comparative example 1, both the width and thickness of the wiring are equal between the first region and the second region. In this case, while the characteristic impedance in the second region having no semiconductor chip above the wiring was 56Ω, that in the first region having a semiconductor chip above the wiring was 35Ω, which is lower than that in the second region by nearly 40%. Comparative example 2, as in comparative example 1, is constructed so that both the width and thickness of the wiring is equal between the first region and the second region, but the width of the wiring is narrowed to 40 μm in both the first region and the second region. In this case, while the characteristic impedance in the second region having no semiconductor chip above the wiring was 98Ω, that in the first region having a semiconductor chip above the wiring was 84Ω, which is lower than that in the second region by approximately 15%. Meanwhile, in comparative example 3, while the width of the wiring in the second region remaining 270 μm, the width of the wiring in the first region was narrowed to 80 μm. As a result, both the characteristic impedances in the first region and the second region became approximately 60Ω, and thus, they could be made to be substantially equal to each other.

Next, the advantageous effects of the present embodiment will be described. In the present embodiment, the cross-sectional area of the wiring 110 in the interposer 102 is different between the first region 150 and the second region 160. More specifically, the width of the wiring 110 in the first region is narrower than the width of the wiring 110 in the second region. Consequently, the characteristic impedance in the first region and the characteristic impedance in the second region become substantially equal to each other. Accordingly, it is possible to reduce waveform distortion and/or reflection of a signal travelling in the wiring 110. Furthermore, as a result of reduction of reflection and noise of a signal, a desired stable signal can be input to the semiconductor chip 108.

In the present embodiment, the semiconductor chip 108 is an LSI having a logic circuit function. Since an LSI having a logic circuit function is required to operate at high speed, it is particularly largely affected by the effect of reflection of a signal caused by a difference in characteristic impedance. Accordingly, the semiconductor device according to the present invention that can provide a characteristic impedance match over the entire wiring is particularly effective where it incorporates an LSI having a logic circuit function therein.

The present embodiment can provide an impedance match over the entire wiring in the interposer without addition of passive components such as a chip capacitor and/or a chip resistor. Accordingly, the structure of the interposer 102 can be simplified compared to conventional ones, suppressing an increase in size and complexity of the interposer 102. Furthermore, the need for a new equipment investment for incorporating such passive components can be eliminated, and the device can be manufactured with the existing equipment, enabling reduction of the manufacturing costs.

Furthermore, in the present embodiment, as a result of the width of the wiring in the first region of the interposer 102 being able to be narrowed, various advantageous effects can be provided. First, cross-talk noise between the wiring and an adjacent wiring in the region can be reduced.

Second, the capacity of the center part of the surface of the interposer 102, on which the semiconductor chip is mounted, to have wirings thereon is enhanced. In other words, the wiring, which has conventionally been arranged in an inner portion of the interposer, can be arranged in the outermost surface layer of the interposer 102. As a result, the power supply layer or the ground layer in the interposer can be formed on the entire wiring layer, enabling the semiconductor device 100 to operate stably.

Third, the capacity of the center part of the surface of the interposer 102, on which the semiconductor chip is mounted, to have wirings thereon is enhanced, and the wiring, which has been arranged in an inner portion of the interposer, can be arranged in the outermost surface layer of the interposer 102. As a result, variation in the density of the wirings in the outermost surface layer of the interposer 102 can be prevented, providing a uniform density. As a result, irregularities of the surface caused due to erosion or dishing, etc., can be suppressed in a planarization process during manufacturing of an interposer.

It should be understood that the aforementioned advantageous effects provided by making the wiring width be narrower than conventional ones is especially significant when the area of the semiconductor chip is large.

Second Embodiment

Figure 6:
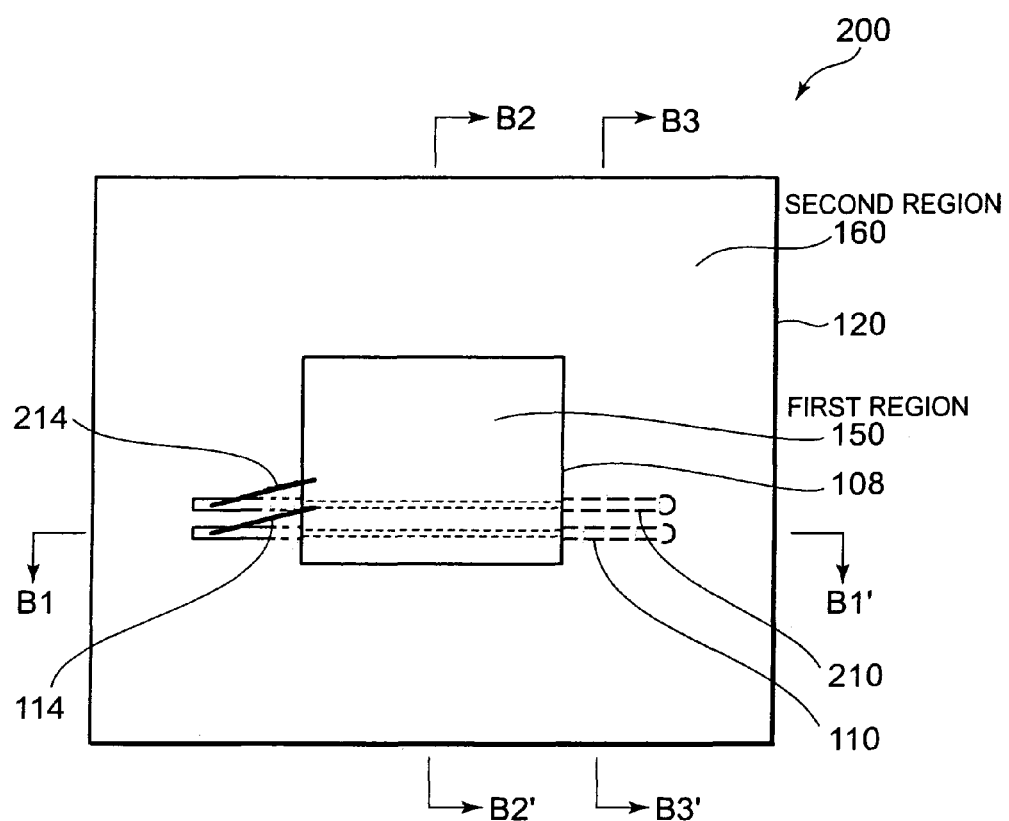
FIG. 6 is a plan view of a second embodiment of a semiconductor device according to the present invention.
Figure 7A:
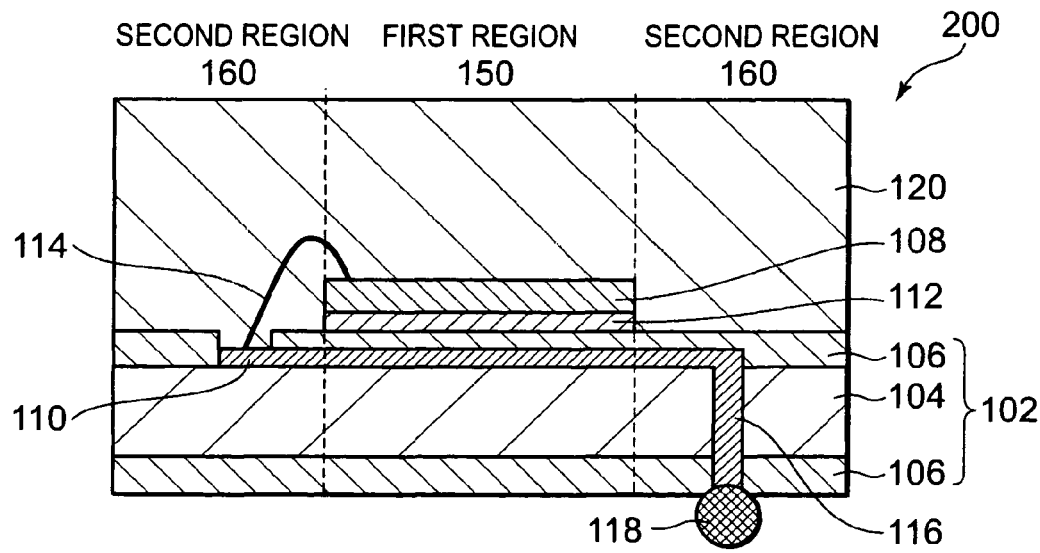
FIGS. 7A to 7C are cross-sectional views of a second embodiment of a semiconductor device according to the present invention.
Figure 7B:
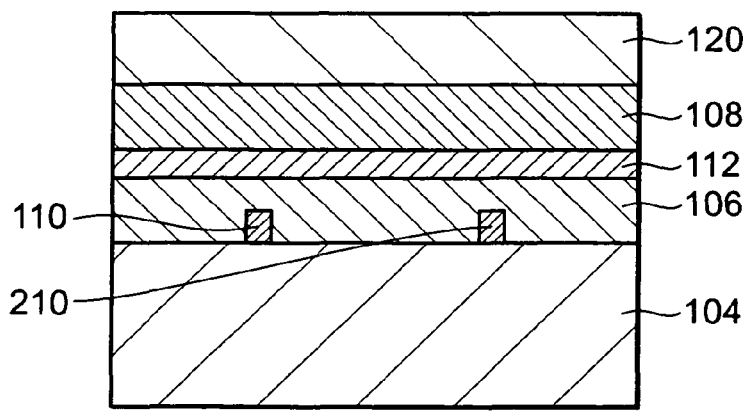
Figure 7C:
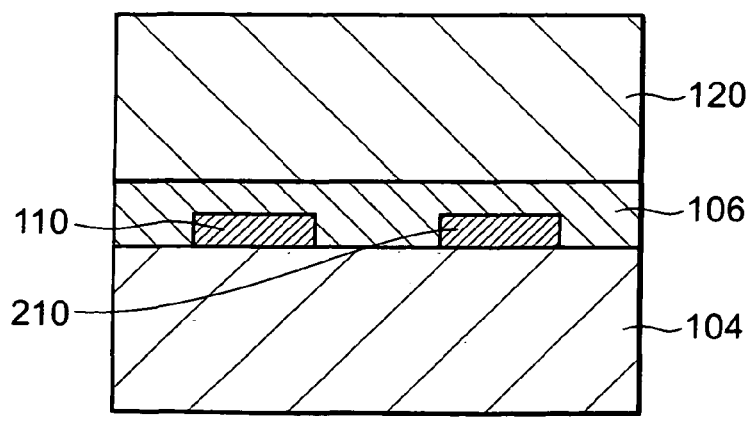

FIG. 6 is a plan view of the configuration of a semiconductor device 200 according to a second embodiment. FIG. 7A is a cross-sectional view of the semiconductor device 200 taken along B1-B1' of FIG. 6. FIG. 7B is an enlarged view of a portion of the semiconductor device 200 around a wiring in cross section taken along B2-B2' of FIG. 6. FIG. 7C is an enlarged view of a portion of the semiconductor device 200 around a wiring in cross section taken along B3-B3' of FIG. 6. In FIG. 6, a molding resin 120 is not shown. The semiconductor device 200 is different from the semiconductor device 100 in that a wiring 210 adjacent to a wiring 110 is arranged to transmit a differential signal.

Example designs of the semiconductor device 200 using a differential signal are shown in Table 2. In comparative example 4, both the width and thickness of the wiring are equal between the first region and the second region. In this case, while the characteristic impedance in the second region was 107Ω, that in the first region was 94Ω, which is lower than that in the second region by no less than 10%. Meanwhile, in comparative example 5, the width of the wiring in the first region was narrowed from 80 μm to 50 μm. As a result, while the characteristic impedance in the second region was 107Ω, that in the first region was 113Ω, and thus, they could be made to be substantially equal to each other. Thus, the semiconductor device and designing method according to the present invention are also effective for a wiring that handles a differential signal.

TABLE 2

| Comparative Example | Wiring Thickness | Wiring Width | | Characteristic Impedance | |
|---|---|---|---|---|---|
| | | First Region | Second Region | First Region | Second Region |
| 4 | 15 μm | 80 μm | 80 μm | 94 Ω | 107 Ω |
| 5 | 15 μm | 50 μm | 80 μm | 113 Ω | 107 Ω |

Third Embodiment

Figure 8A:
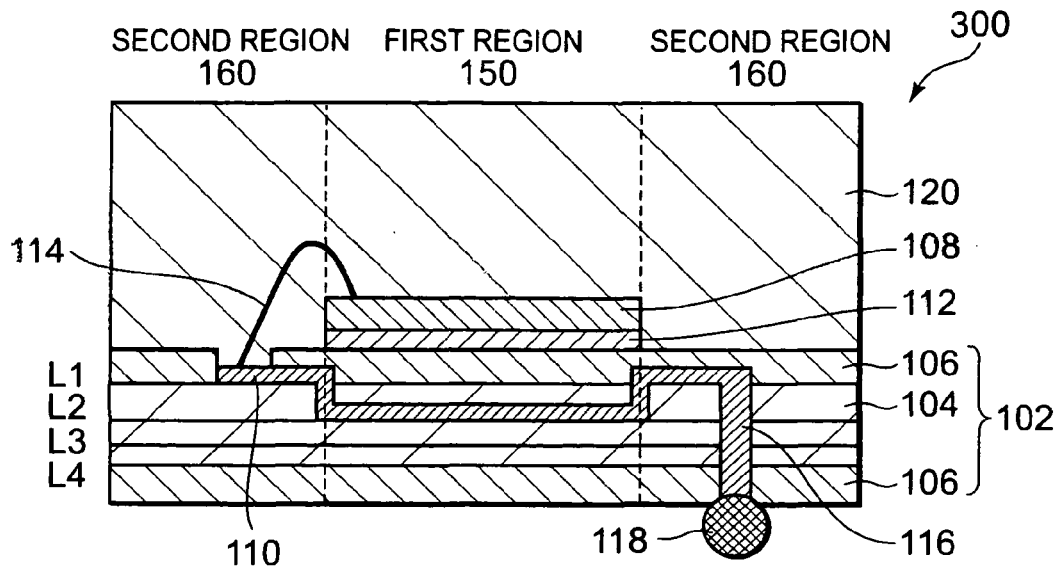
FIG. 8A to 8C are cross-sectional views of a third embodiment of a semiconductor device according to the present invention.
Figure 8B:
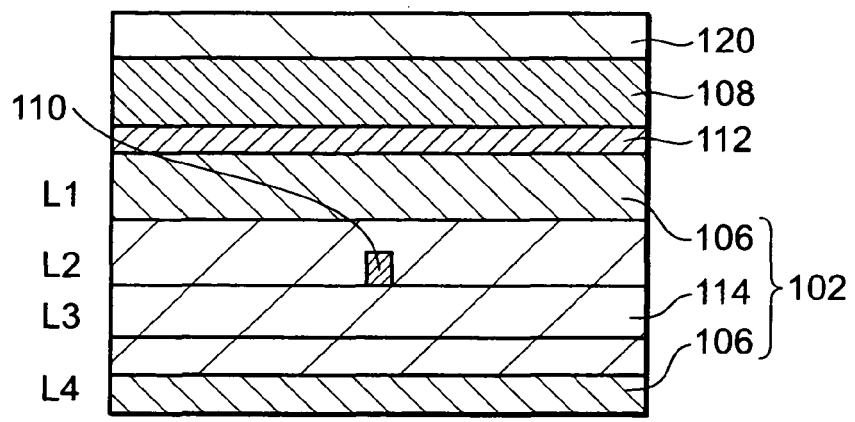
Figure 8C:
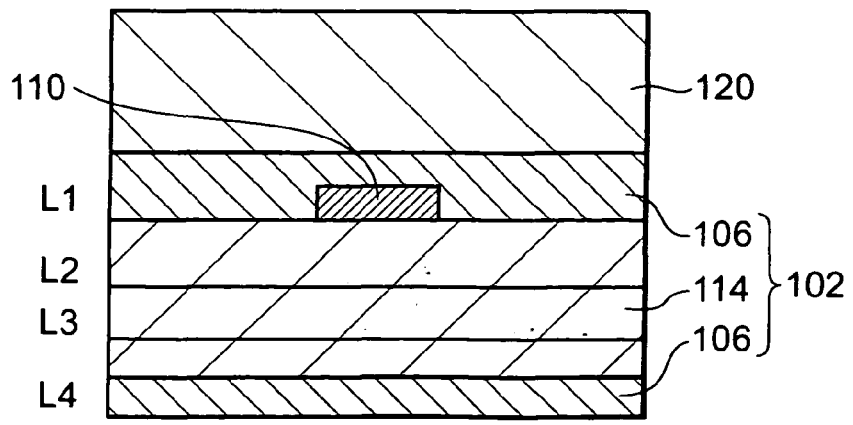

In the semiconductor device 100 described in the first embodiment, the wiring 110 in the first region 150 and the wiring 110 in the second region 160 are provided in the same layer, but the wiring in the first region in the interposer may be provided in a layer that is different from the layer in which the wiring in the second region is provided. FIGS. 8A, 8B and 8C are cross-sectional views of a third embodiment of a semiconductor device 300 according to the present invention. Since the plan view in the present embodiment is similar to that in the first embodiment, FIG. 1 is applied. FIG. 8A is a cross-sectional view taken along A1-A1' of FIG. 1. FIG. 8B is an enlarged view of a portion around a wiring in cross section taken along A2-A2' of FIG. 1. FIG. 8C is an enlarged view of a portion around a wiring in cross section taken along A3-A3' of FIG. 1.

In the present embodiment, an interposer 102 includes four wiring layers, which are wiring layers L1, L2, L3 and L4 from the side of the interposer 102 where the semiconductor chip 108 is mounted. In a second region 160, a wiring 110 is provided in the wiring layer L1. Meanwhile, in a first region 150, the wiring 110 is provided in the wiring layer L2. In other words, the distance between the semiconductor chip 108 and the wiring 110 in the first region 150 is larger than that of the first embodiment. Furthermore, the width of the wiring 110 in the first region 150 is narrowed. As a result, the effect of the semiconductor chip 108 on the wiring in the first region 150 is reduced, enabling the width of the wiring 110 to be wider than that of the semiconductor device according to the first embodiment. Consequently, the characteristic impedances of the first region and the second region can be matched while suppressing an increase in electric resistance of the wiring caused as a result of the wiring being narrowed.

Table 3 indicates examples of the results of designing the semiconductor device 300 according to the present embodiment. In the calculation, h1=185 μm and h2=125 μm for the first region, while h1=240 μm and h2=70 μm for the second region, which were the same as those in the first embodiment. The rest of the values were the same in the first embodiment.

In comparative example 8, although the width of the wiring in the first region is 85 μm, which is wider than that of comparative example 3, the characteristic impedances are substantially equal to each other.

TABLE 3

| Comparative Example | Wiring Thickness | Wiring Width | | Characteristic Impedance | |
|---|---|---|---|---|---|
| | | First Region | Second Region | First Region | Second Region |
| 6 | 15 μm | 150 μm | 270 μm | 49 Ω | 56 Ω |
| 7 | 15 μm | 40 μm | 40 μm | 79 Ω | 97 Ω |
| 8 | 15 μm | 85 μm | 270 μm | 60 Ω | 56 Ω |

Fourth Embodiment

Figure 9:
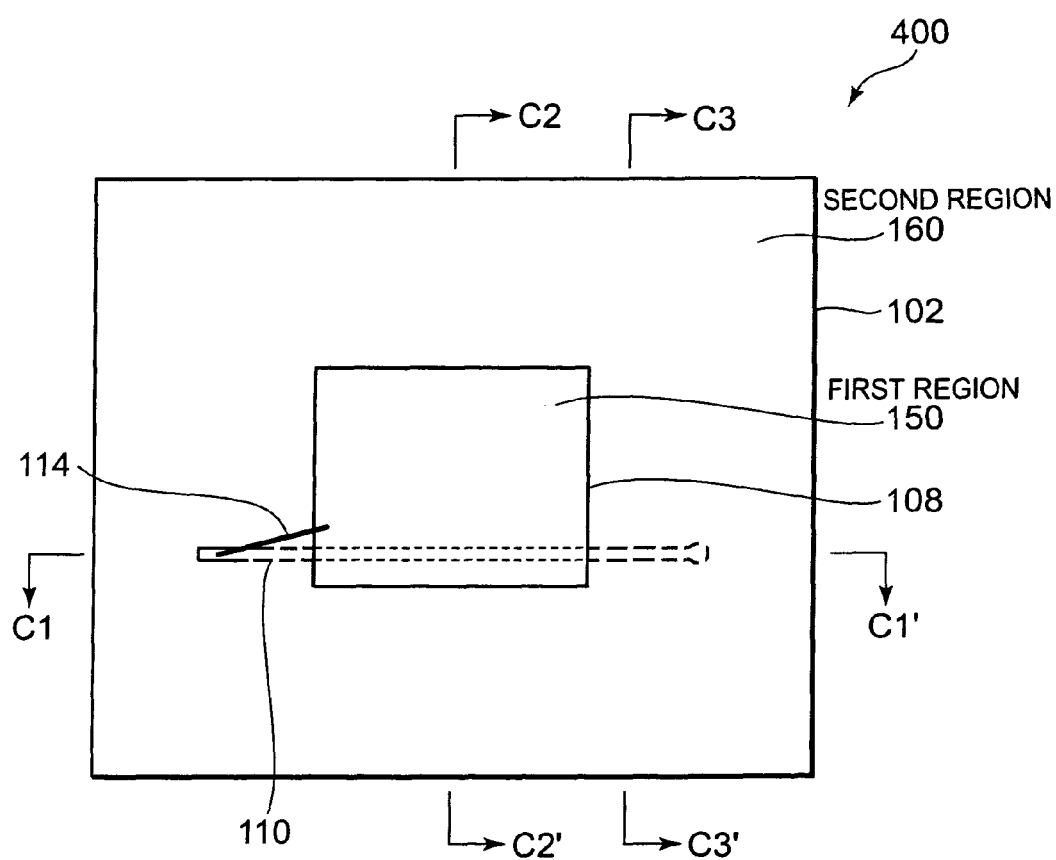
FIG. 9 is a plan view of a fourth embodiment of a semiconductor device according to the present invention.
Figure 10A:
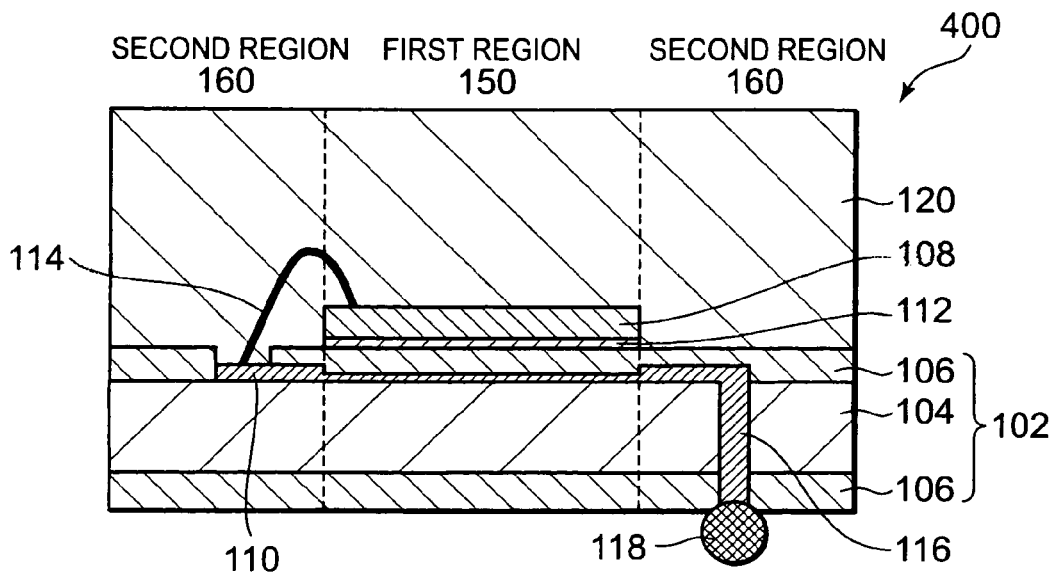
FIGS. 10A to 10C are cross-sectional views of a fourth embodiment of a semiconductor device according to the present invention.
Figure 10B:
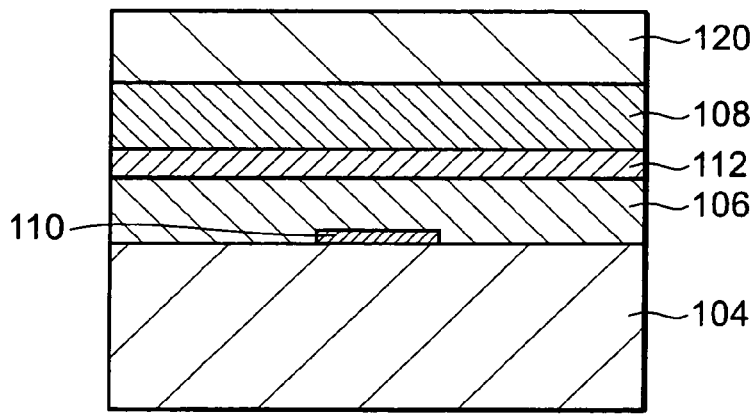
Figure 10C:
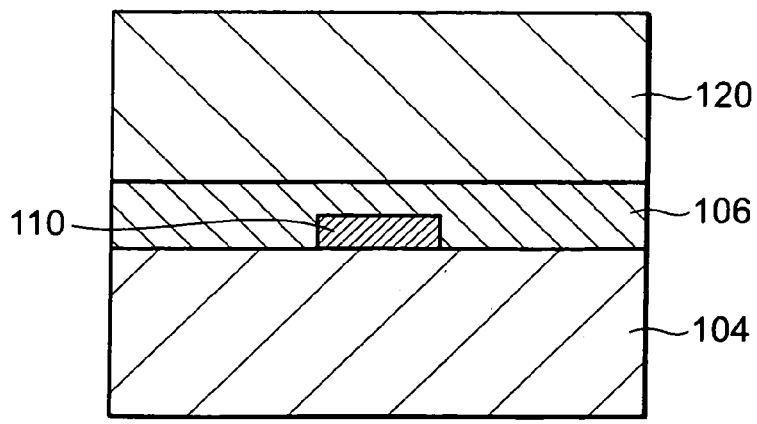

Although in the semiconductor device described in the first embodiment, the cross-sectional area of the wiring 110 was changed by changing the width of the wiring, the cross-sectional area may be changed by changing the thickness of the wiring. FIG. 9 is a plan view of the configuration of a semiconductor device according to a fourth embodiment. FIG. 10A is a cross-sectional view of the semiconductor device taken along C1-C1' of FIG. 9. FIG. 10B is an enlarged view of a portion around a wiring of the semiconductor device in cross section taken along C2-C2' of FIG. 9. FIG. 10C is an enlarged view of a portion around a wiring of the semiconductor device in cross section taken along C3-C3' of FIG. 9. In FIG. 9, a molding resin 120 is not shown.

In the semiconductor device according to the present embodiment, the width of the wiring are the same between the first region and the second region, and the cross-sectional area of the wiring is changed by reducing the thickness of the wiring in the first region. Furthermore, the lower surface of the wiring in the first region and that in the second region are on the same plane. As a result, the distance between the semiconductor chip 108 and the wiring 110 in the first region becomes large, enabling reduction of the effect of the semiconductor chip 108 on the wiring 110. Accordingly, the characteristic impedance of the wiring in the first region and that in the second region can be made to be substantially equal to each other.

The semiconductor device according to the present invention is not limited to the above-described embodiments, various modifications are possible. For example, while the above embodiments have been described in terms of the case where one semiconductor chip is mounted on the interposer 102, a plurality of semiconductor chips may be mounted.

Figure 11:
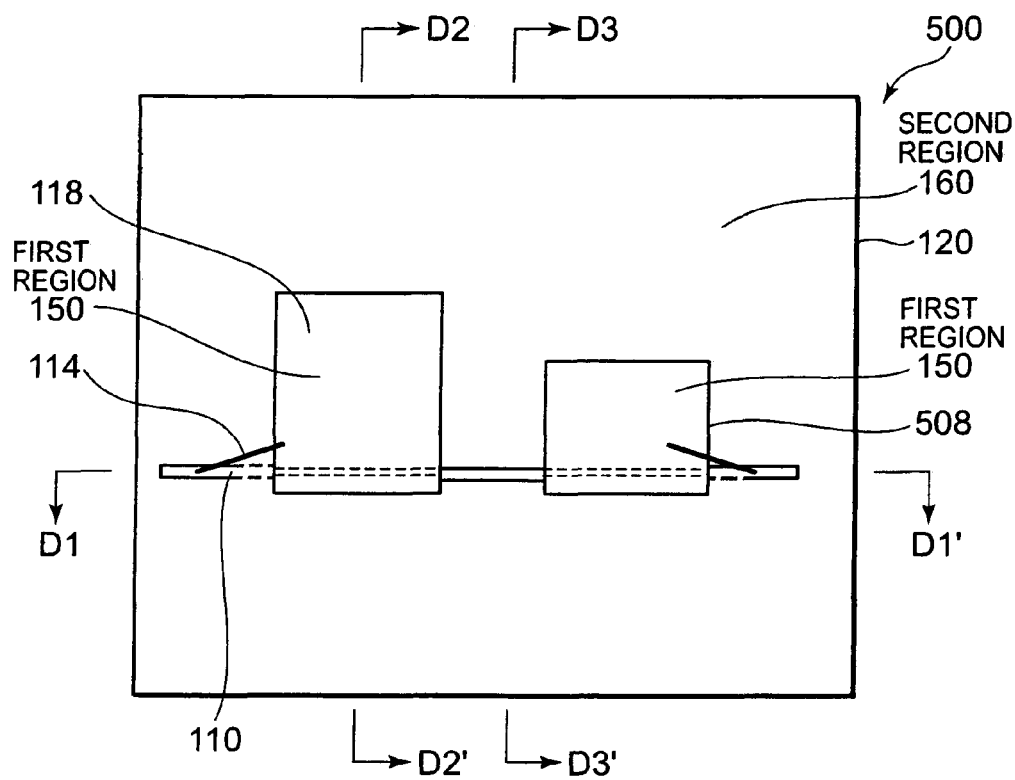
FIG. 11 is a plan view of a modification of an embodiment.
Figure 12:
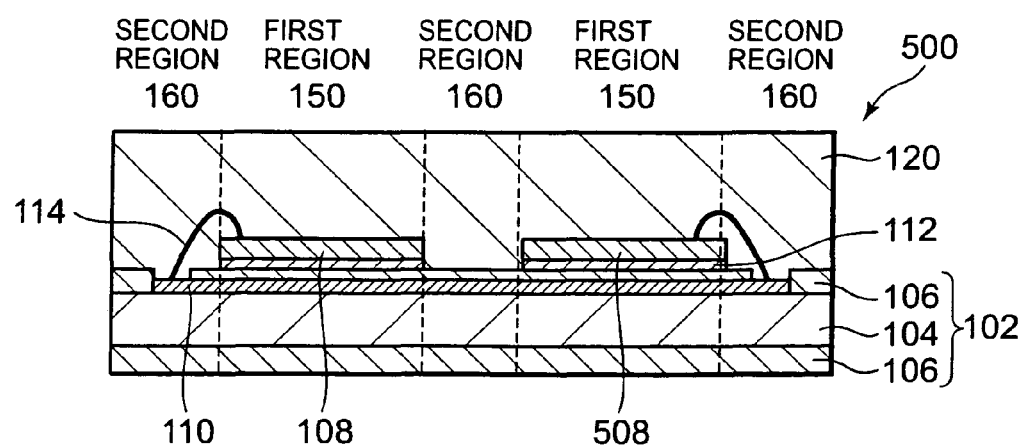
FIG. 12 is a cross-sectional view of a modification of an embodiment.

FIG. 11 is a plan view of the configuration of a semiconductor device where a plurality of semiconductor chips are mounted. FIG. 12 is a cross-sectional view of the semiconductor device taken along D1-D1' of FIG. 12. The cross-sectional view in the direction perpendicular to the direction in which the wiring extends is omitted because it is similar to that of embodiment 1. A semiconductor device 500 includes an interposer 102 with a semiconductor chip 108 and a semiconductor chip 508 mounted thereon. In the present embodiment, the semiconductor chip 108 is an LSI having a logic circuit function, and the semiconductor chip 508 is a LSI having a general-purpose memory circuit function. Also, in the present embodiment, the regions where the semiconductor chip 108 and the semiconductor chip 508 overlap in a plan view are first regions 150, and the region excluding the first regions 150 is a second region 160. The cross-sectional area of a wiring 110 in each of the first regions 150 is different from that in the second region 160. More specifically, the wiring width in each of the first regions 150 is narrower than the wiring width in the second region 160.

The semiconductor device 500 in FIGS. 11 and 12 has a SiP (System in Package) structure. In the case of a semiconductor SiP structure, the portions below the semiconductor chips are often used for wiring regions, and accordingly, the semiconductor device and designing method according to the present invention are effective means. Also, in designs considering EMC (Electro-Magnetic Compatibility) in which the portions below the semiconductor chips are also often used for wiring regions, the present invention is effective means.

Figure 13:
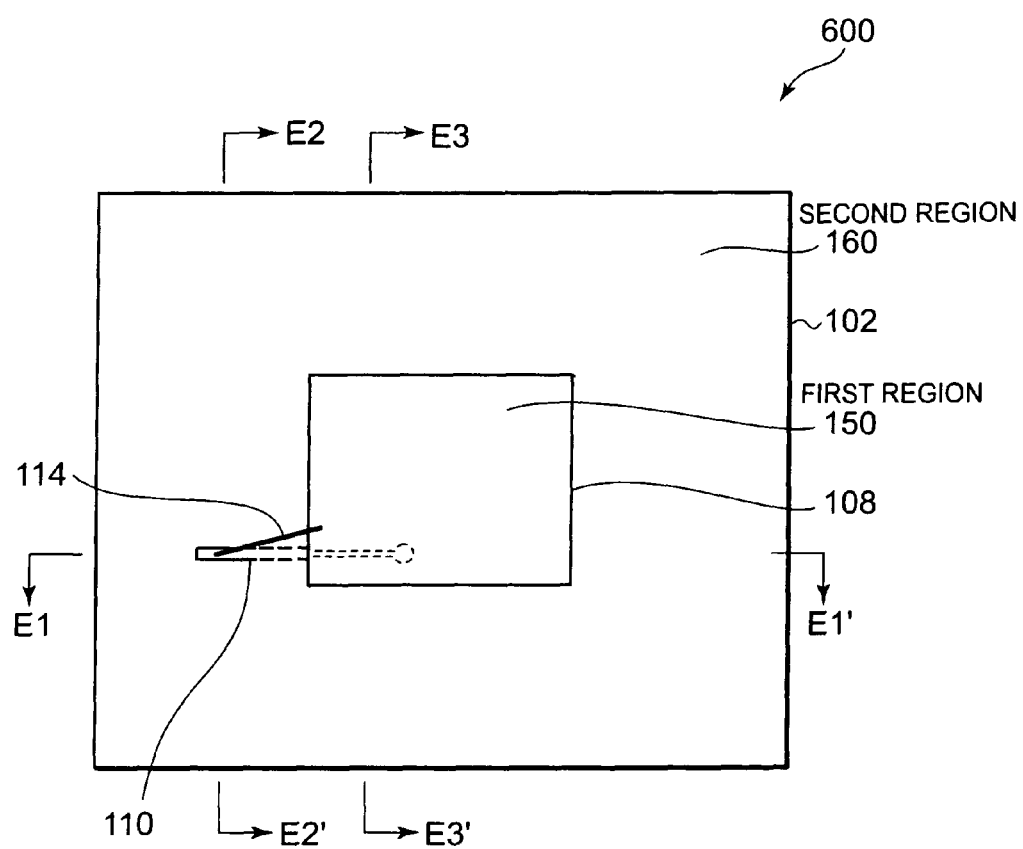
FIG. 13 is a plan view of a modification of an embodiment.
Figure 14A:
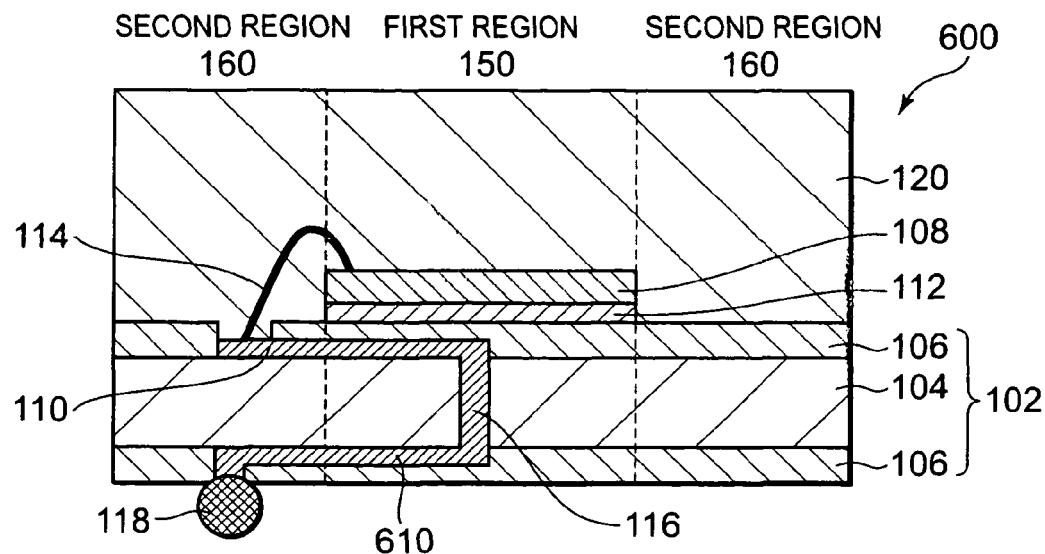
FIGS. 14A to 14C are cross-sectional views of a modification of an embodiment.
Figure 14B:
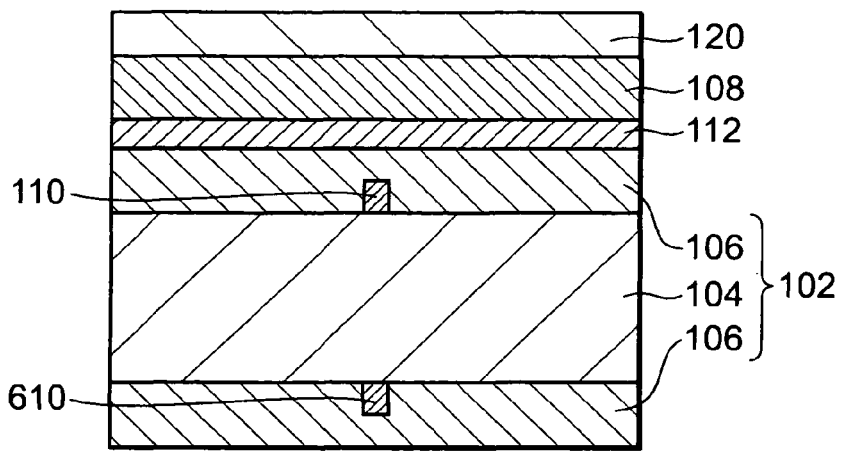
Figure 14C:
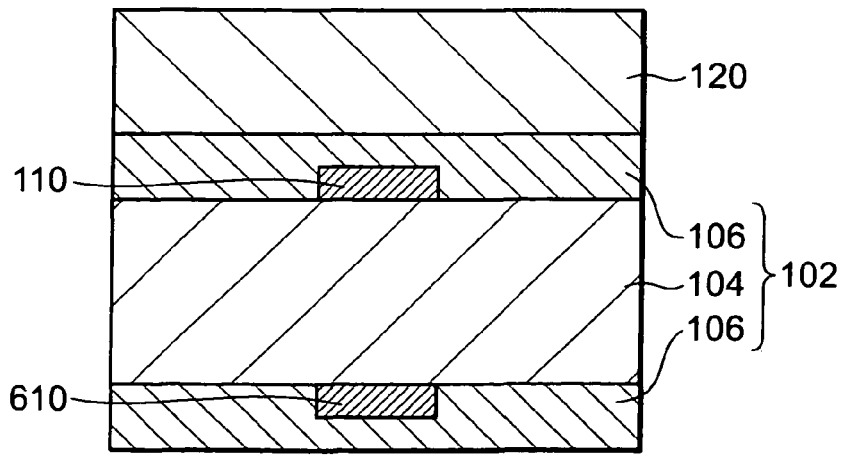

While the above-described embodiments have been described in terms of the case where the wiring 110 traverses the semiconductor chip 108 in a plan view, the wiring 110 may extend only up to the middle of the semiconductor chip 108 in a plan view. FIG. 13 shows an example of a semiconductor device 600 in which a wiring 110 extends only up to the middle of a semiconductor chip 108 in a plan view. FIG. 14A is a cross-sectional view of the semiconductor device 600 taken along E1-E1' of FIG. 13. FIG. 14B is an enlarged view of a portion around the wiring of the semiconductor device 600 in cross section taken along E2-E2' of FIG. 13. FIG. 14C is an enlarged view of a portion around the wiring of the semiconductor device 600 in cross section taken along E3-E3' of FIG. 13. In FIG. 13, a molding resin 120 is not shown.

In the semiconductor device 600, the wiring 110 extends up to the middle of a first region 150, and is connected to a wiring 610 in a lower layer via a through electrode 616. The wiring 610 is arranged just below the wiring 110, and extends up to a second region 160 and is connected to a solder ball. Even in such wiring layout, a characteristic impedance match over the entire wiring can be provided by narrowing the widths of the wiring 110 and the wiring 610 in the first region 150.

Also, where it is difficult to match the characteristic impedances only by means of the cross-sectional area of the wiring 110, the characteristic impedances may be matched by changing the thickness of the mounting material 112 used to mount the semiconductor chip 108 on the interposer to change the distance between the semiconductor chip 108 and the wiring 110. This configuration is effective for the case where a significant increase in electric resistance of the wiring 110 in the first region occurs if the width of the wiring is overly narrowed. In other words, while the width of the wiring 110 in the first region 150 is narrowed to the degree that the resulting electric resistance increase is insignificant, the thickness of the mounting material 112 is increased to increase the distance between the semiconductor chip 108 and the wiring 110, enabling the provision of a characteristic impedance match over the entire wiring 110.

Also, while in the above embodiments, the mounting material 112 is of an insulating material, a conductive material, such as Ag paste, may be used. In this case, the mounting material acts as a reference conductor plane.

Figure 15:
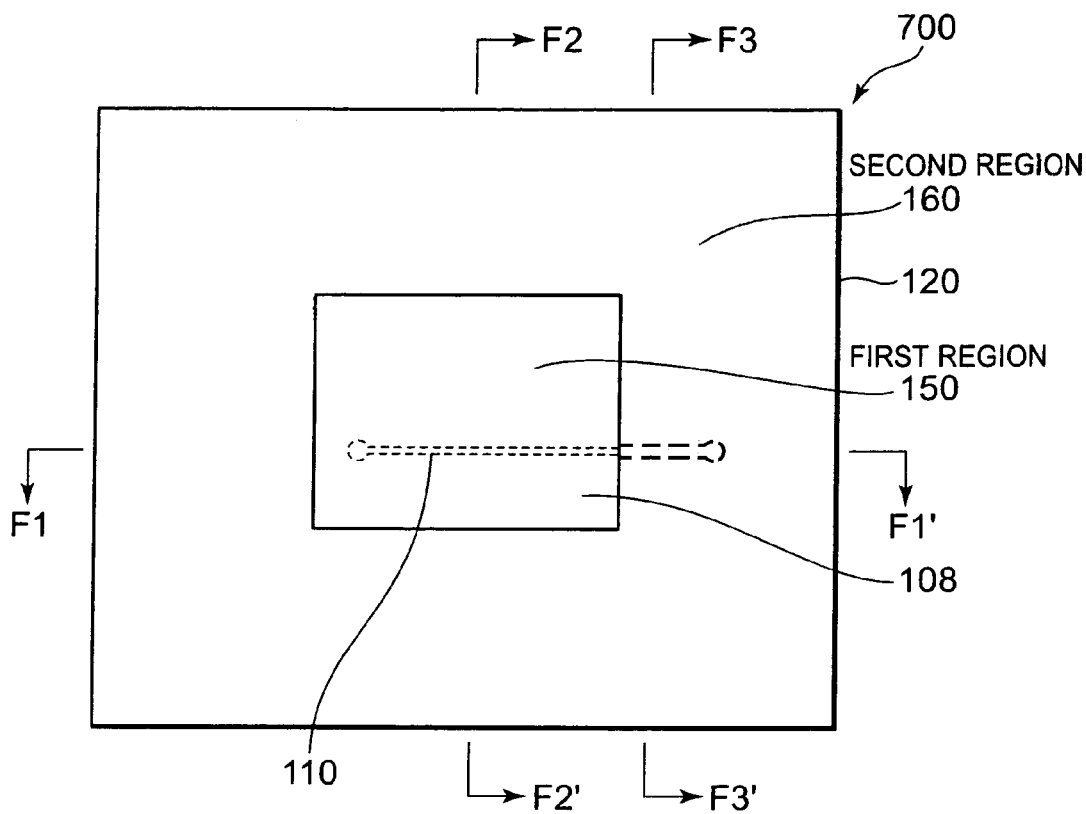
FIG. 15 is a plan view of a modification of an embodiment.
Figure 16:
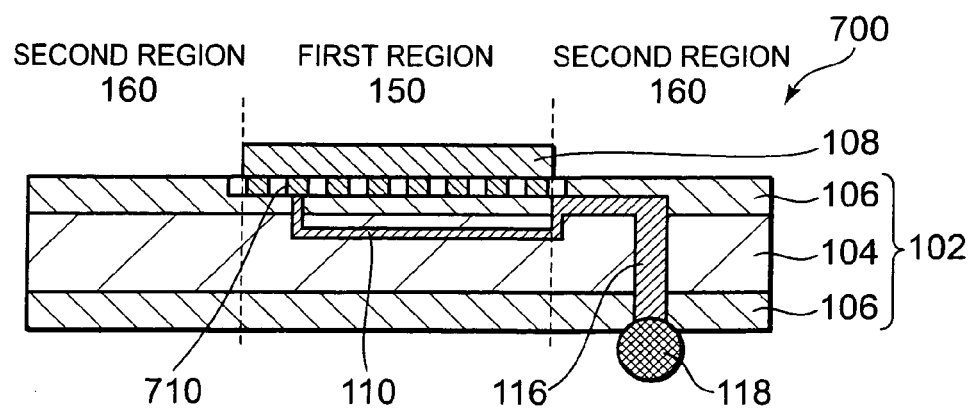
FIG. 16 is a cross-sectional view of a modification of an embodiment.

Furthermore, while the above embodiments have been described in terms of a semiconductor device including a semiconductor chip 108 mounted on an interposer 102 via a mounting material 112, the semiconductor chip 108 may be connected on the interposer 102 by means of flip-chip bonding. FIG. 15 is a plan view of the configuration of a semiconductor device 700 in which a semiconductor chip is mounted by means of flip-chip bonding. FIG. 16 is a cross-sectional view of the semiconductor device taken along F1-F1' of FIG. 16. The cross-sectional view in the direction perpendicular to the direction in which the wiring extends is omitted because it is similar to that of embodiment 3. In the semiconductor device 700, a semiconductor chip 108 is mounted by means of flip-chip bonding via solder bumps 710. In the semiconductor device 700, also, a characteristic impedance match can be provided over the entire wiring 110 by reducing the width of the wiring 110 in a first region 150.

Also, while the above embodiments have been described in terms of examples of a semiconductor device in which a semiconductor chip 108 is mounted on an interposer 102, the semiconductor chip 108 may be embedded in the interposer 102. In this case, since the distance between the wiring 110 in the interposer 102 and the semiconductor chip 108 become small, the semiconductor device and designing method according to the present invention are highly effective.

Also, while the above embodiments have been described in terms of examples of a semiconductor device with the cross-sectional area of a wiring 110 changed by changing either the width or the thickness of the wiring 110, both the width and the thickness of the wiring 110 may be changed.

Furthermore, while the above embodiments have been described in terms of examples of a semiconductor device designing method in which a ground layer in a printed wiring board 124 is used as a reference conductor plane, a power supply layer in the printed wiring board may be a reference conductor plane since the reference conductor plane may be any conductor having a fixed potential. Also, where a wiring layer having a fixed potential, that is, a ground layer or a power supply layer, is provided in an interposer 102, the wiring layer in the interposer 102 may used as a reference conductor plane.

What is claimed is:

1. A semiconductor device comprising: an interposer; and a semiconductor chip mounted on the interposer, wherein, in a plan view, the interposer includes a first region overlapping the semiconductor chip, and a second region excluding the first region, and the interposer includes at least one wiring therein, the wiring being formed astride the first region and the second region, wherein a cross-sectional area of the wiring in the first region of the interposer is smaller than a cross-sectional area of the wiring in the second region of the interposer, wherein the semiconductor chip is mounted on the interposer via a mounting material, an upper surface of the semiconductor chip comprising a circuit and a pad, and wherein the wiring in the second region of the interposer and the pad on the semiconductor chip are electrically connected via a wire, wherein a characteristic impedance of the wiring in the first region is substantially equal to a characteristic impedance of the wiring in the second region.

2. The semiconductor device according to claim 1, wherein a width of the wiring in the first region is narrower than a width of the wiring in the second region.

3. The semiconductor device according to claim 1, wherein a thickness of the wiring in the first region is thinner than a thickness of the wiring in the second region.

4. The semiconductor device according to claim 3, wherein a lower surface of the wiring in the first region and a lower surface of the wiring in the second region are on a same plane.

5. The semiconductor device according to claim 1, wherein the interposer includes a plurality of wiring layers, and
    wherein the wiring in the first region and the wiring in the second region are provided in different wiring layers.

6. The semiconductor device according to claim 1, wherein the semiconductor chip is mounted on the interposer via a solder resist.

7. The semiconductor device according to claim 1, further comprising a printed wiring board with the interposer mounted thereon.

8. The semiconductor device according to claim 1, wherein the semiconductor chip comprises an LSI (large-scale integration) including a logic circuit function.

9. The semiconductor device according to claim 1, wherein, in the cross-sectional area, a border of the first region overlaps with an edge of the semiconductor chip.

10. The semiconductor device according to claim 1, wherein a solder resist is disposed between the wiring and the mounting material.

11. The semiconductor device according to claim 1, wherein a solder resist is disposed on an upper surface of the wiring in the first region and in the second region, said wire abutting an unexposed portion of the wiring in the second region.

12. The semiconductor device according to claim 1, wherein a lower surface of the wiring in the first region is co-planner with a lower surface of the wiring in the second region.

* * * * *